United States Patent
Vuong et al.

(10) Patent No.: US 7,196,903 B2
(45) Date of Patent: Mar. 27, 2007

(54) MULTIPLE SOURCE FAN CONTROL WITH OVERRIDE

(75) Inventors: Vinh T. Vuong, Cypress, TX (US); Stephen M. Zaudtke, Spring, TX (US); Raghavan V. Venugopal, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 616 days.

(21) Appl. No.: 10/407,620

(22) Filed: Apr. 4, 2003

(65) Prior Publication Data

US 2004/0199797 A1   Oct. 7, 2004

(51) Int. Cl.
| H05K 7/20 | (2006.01) |
| G06F 1/20 | (2006.01) |
| G05B 11/01 | (2006.01) |
| G05B 9/02 | (2006.01) |
| G05B 17/00 | (2006.01) |
| G05D 23/00 | (2006.01) |

(52) U.S. Cl. .................. 361/695; 361/687; 700/21; 700/79; 318/471; 340/584

(58) Field of Classification Search ............ 361/679, 361/683, 687, 688, 695; 713/300; 318/471; 700/21, 79, 81; 340/500, 540, 584
See application file for complete search history.

(56) References Cited

U.S. PATENT DOCUMENTS

| 5,234,050 A | * | 8/1993 | Weigert .................. 165/202 |
| 5,436,827 A | * | 7/1995 | Gunn et al. ................. 700/82 |
| 5,526,289 A | | 6/1996 | Dinh et al. |
| 5,528,229 A | * | 6/1996 | Mehta .................... 340/3.4 |
| 5,566,377 A | | 10/1996 | Lee |
| 5,722,887 A | * | 3/1998 | Wolfson et al. ............ 454/256 |
| 5,731,954 A | | 3/1998 | Cheon |
| 5,805,403 A | | 9/1998 | Chemla |
| 5,926,386 A | | 7/1999 | Ott et al. |
| 5,930,110 A | | 7/1999 | Nishigaki et al. |
| 5,957,064 A | * | 9/1999 | Barry et al. ............... 110/188 |
| 6,023,402 A | * | 2/2000 | Kaminski .................. 361/103 |
| 6,134,667 A | | 10/2000 | Suzuki et al. |
| 6,135,718 A | | 10/2000 | Yang |
| 6,172,611 B1 | | 1/2001 | Hussain et al. |
| 6,188,189 B1 | | 2/2001 | Blake |
| 6,204,623 B1 | | 3/2001 | Levy et al. |
| 6,205,547 B1 | | 3/2001 | Davis |
| 6,243,656 B1 | | 6/2001 | Arai et al. |
| 6,255,973 B1 | | 7/2001 | Smith et al. |
| 6,321,175 B1 | | 11/2001 | Nagaraj |

(Continued)

FOREIGN PATENT DOCUMENTS

JP    11272365 A    10/1999

OTHER PUBLICATIONS

Charles J. Stancil et al., "Computer Fan Speed System To Reduce Audible Perceptibility Of Fan Speed Changes," U.S. Appl. No. 09/443,575, filed Nov. 19, 1999 (23 p.).

(Continued)

*Primary Examiner*—Crystal J. Barnes

(57) ABSTRACT

An electronic system may comprise a variable speed fan, a first source coupled to the fan, and a second source coupled to the fan. Either of the first or second sources may control the speed of the fan.

21 Claims, 2 Drawing Sheets

U.S. PATENT DOCUMENTS 6,470,289 B1     10/2002   Peters et al.
6,856,139 B2 *    2/2005   Rijken et al. ............... 324/537
6,891,347 B2 *    5/2005   Dobbs et al. ............... 318/471

OTHER PUBLICATIONS

Clarence R. Thompson et al., "Cascadable Dual Fan Controller," U.S. Appl. No. 10/034,218, filed Dec. 28, 2001 (14 p.).

Gregory P. Ziarnik, "Adaptive Fan Controller For A Computer System," U.S. Appl. No. 10/036,273, filed Dec. 26, 2001(24p.).

"Mobile Pentium II Processor and Pentium II Processor Mobile Module Thermal Sensor Interface Specifications," Intel Corporation, AP-825, Application Note, Apr. 1998, Order No. 243724-001.

"System Management Bus Specification," Smart Battery System Specifications, Revision 1.1, Dec. 11, 1998, Copyright 1996, 1997, 1998, Benchmarq Microelectronics Inc., Duracell Inc., Energizer Power Systems, Intel Corporation, Linear Technology Corporation, Maxim Integrated Products, Mitsubishi Electric Corporation, National Semiconductor Corporation, Toshiba Battery Co., Varta Batterie AG.

"Mobile Pentium II Processor In Mini-Cartridge Package At 366 MHZ, 300 PE MHZ, and 266 PE MHZ," Intel Corporation, Order No. 245108-001.

"Low Cost PC Temperature Monitor And Fan Control ASIC," Analog Devices, Preliminary Technical Data, ADM1022, Rev. PrJ 3/00 (20 p.).

Variable Speed Control For A DC Fan, Mar. 1, 1990, IBM Technical Discloser Bulletin, vol. No. 32.

Alfano, et al., Intelligent Thermal Management Using Brushless DC Fans, 1998, IEEE, TelCom Semiconductor.

* cited by examiner

MULTIPLE SOURCE FAN CONTROL WITH OVERRIDE

BACKGROUND

Computer systems include numerous electrical components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, each manufacturer designs its products to operate correctly within a predetermined temperature range. If the temperature exceeds the predetermined range (i.e., the device becomes too hot or too cold), the device may not function correctly thereby potentially degrading the overall performance of the computer system. Thus, it is desirable for a computer system generally, and its components specifically, to operate within a thermally benign environment.

Some computer systems include one or more fans to blow air over the electronics to keep the electronics cool. A fan's ability to cool a computer may be a function of the volume of airflow the fan is able to move per unit of time. Both the size of the fan's blades and the speed at which the fan spins affect the magnitude of airflow. In at least some applications, it is desirable for at least some of the computer's components to be smaller rather than larger. Accordingly, including larger fans in a computer system may not be desirable. It generally may be more practical to control fan speed. Generally, faster fans provide greater cooling ability than slower fans. Fans, however, also make noise and, all else being equal, the noise level is a function of the speed of the fan; faster fans generally are noisier than slower fans.

In some computers, the fan is turned on when the computer is turned on and spun at a predetermined speed until the computer is turned off. Although generally satisfactory for cooling purposes, this approach may result in the fan continuously making a relatively large amount of noise, which may be annoying to the operator of the computer. In other computers, to reduce fan noise, a software driver may be included in the system along with hardware that together can adjust the speed of the fan(s). One or more temperature sensors may also be included to permit the system to monitor its heat load and set the fan speed accordingly. Thus, if the system is relatively cool, the fan can be made to spin at a lower speed, or even turned off to reduce the noise level. Once an increase in temperature is detected, under control of the software driver, the fan speed may be increased. A problem exists as to how to control the fan after system power is enabled, but before the software driver noted above has been loaded and able to control the fan. The subject matter described herein may address this issue.

BRIEF SUMMARY

In some embodiments an electronic system may comprise a variable speed fan, a first source coupled to the fan, and a second source coupled to the fan. Either the first or second source may control the speed of the fan.

BRIEF DESCRIPTION OF THE DRAWINGS

For a detailed description of the embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. All examples included herein should not be interpreted as limiting the scope of the disclosure in any way.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

In accordance with various embodiments of the invention, an electronic system includes a variable speed fan. The fan may be operated by one of at least two control sources. In some embodiments, a first control source may comprise a driver that controls the fan's speed. The driver source may control fan speed in accordance with a system parameter such as temperature. A second source may comprise hardware fan control logic for which software need not be provided to control its operation. The hardware fan control logic also may override any attempt at control of fan speed by the first source and may cause the fan to spin at a predetermined speed. Without limitation, this override feature may be useful when the driver is not present in the system or is present but not yet loaded in memory and operational. When overriding the first source, the second source may control fan speed in accordance with a system parameter such as temperature.

Figure 1:
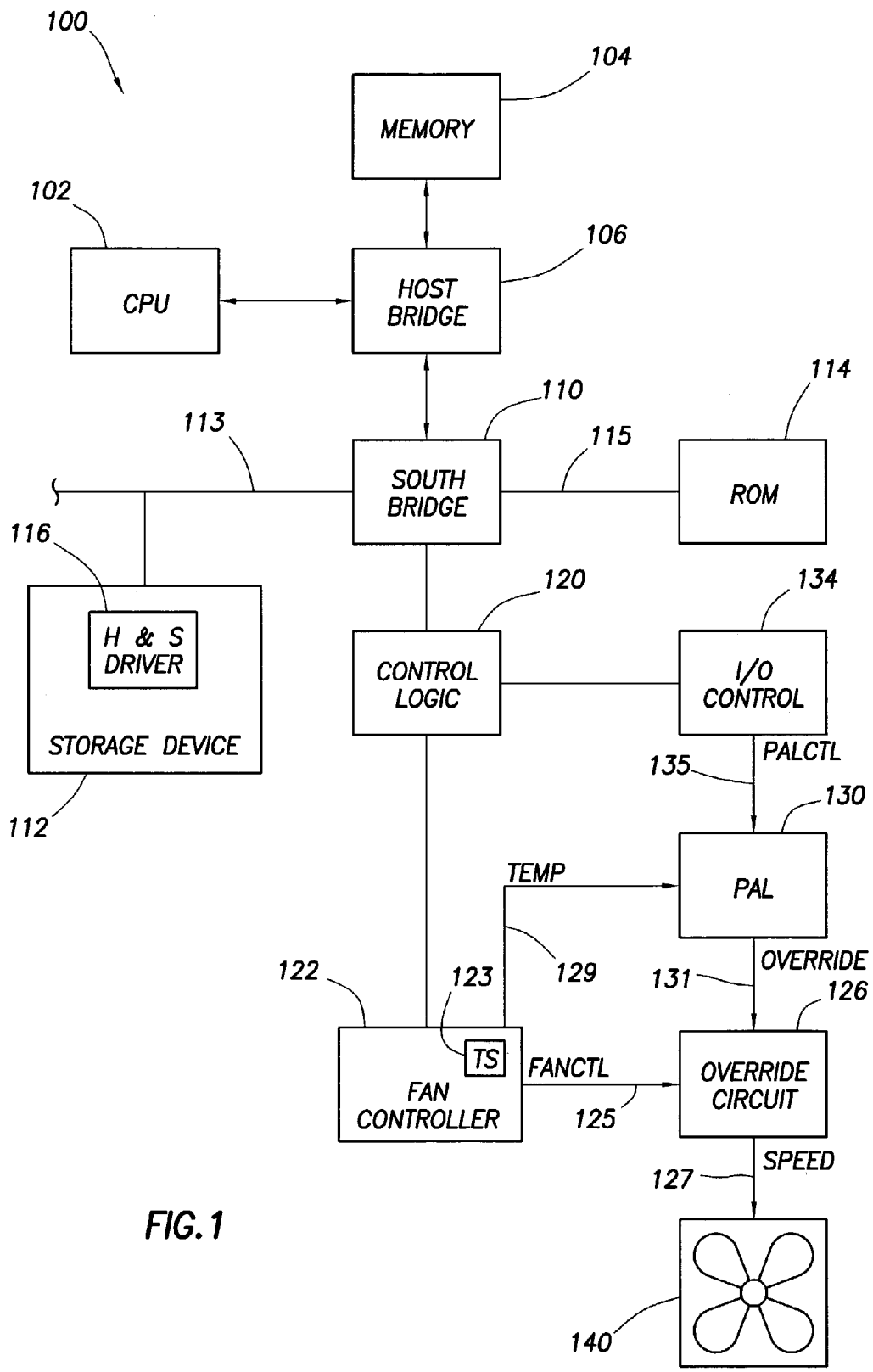
FIG. 1 shows a system diagram in which a first source and a second source are provided to control a variable speed fan in accordance with various embodiments of the invention.

Referring now to FIG. 1, system 100 configured in accordance with an exemplary embodiment of the invention includes a central processing unit ("CPU") 102, memory 104, a host bridge 106, a south bridge 110, and read only memory ("ROM") 114. The system 100 may also include control logic 120, a fan controller 122, an override circuit 126, programmable logic 130, I/O control 134, and a variable speed fan 140. The programmable logic 130 may comprise a programmable array logic ("PAL") or other suitable type of programmable logic. The configuration shown in FIG. 1 is merely exemplary of one of numerous possible configurations. The system 100 may include other components not specifically shown in FIG. 1 and the components may be arranged differently from that shown. System 100 may comprise a computer system, but such need not be the case.

In the configuration shown in FIG. 1, the CPU 102 and memory 104 couple to the host bridge 106. The south bridge 110 may also couple to the host bridge 106. Through the bridges 106 and 110, various of the components in the system 100 may interact with one another. For example, through host bridge 106, the CPU 102 may issue read or write requests to memory 104, which may comprise any suitable type of random access memory ("RAM"). As such, the host bridge 106 may include an integrated memory controller or a memory controller may be included in the system separate from the host bridge 106.

The south bridge 110 may also include coordinating logic for one or more input/output ("I/O") devices such as a keyboard, mouse, etc. (not specifically shown). A storage device 112 (e.g., a hard disk drive) may couple to the south bridge via bus 113 and ROM 114 may couple to the south bridge 110 via the same bus as storage device 112 or a separate bus 115 as shown. The storage device 112 may include a health and status driver 116. The ROM 114 may contain a variety of ROM-based services such as basic input/output system ("BIOS") (not specifically shown) which permits low level control of disk drive accesses and the like. The ROM 114 may also include a BIOS setting for fan speed.

During or after the boot process, the health and status driver may be loaded (i.e., copied) into memory 104 when loading the operating system and executed by CPU 102 from memory. The health and status driver 116 may perform one or more of a variety of functions. It should be understood that the functions attributed to the health and status driver are performed by the CPU 102 executing the health and status driver code. One such function is to monitor the temperature of the system 100 and, through fan controller 122, to cause the fan 140 to spin at a suitable speed given the temperature. To this end, one or more temperature sensors may be included in the system. The fan controller 122 may include a temperature sensor 123 integrated therein. If desired, one or more additional temperatures may be included in the system and connected to the fan controller 122. If the temperature detected by a temperature sensor exceeds a threshold programmed into the fan controller 122 by the health and status driver 116, the health and status driver 116 may be notified in a suitable manner (e.g., through control logic 120) of this condition. In response, the health and status driver 116 may cause the fan controller 122 to make the fan 140 spin faster. If the temperature then falls, the health and status driver 116 may cause the fan controller 122 to reduce the speed of the fan 140, thereby reducing the noise level associated with the fan. Of course, before the health and status driver 116 is loaded and available for use, fan speed control may not be possible via the driver. Further, in other embodiments of the invention, the system 100 may not even have a health and status driver 116, or any other software that performs the same or similar function as the health and status driver, so that fan speed control may never be possible via a software driver. In such cases, fan speed may be set to a final level by the ROM ("BIOS") setting. Control logic 120 may couple to the fan controller 122 and an I/O control 134. The PAL 130 may couple to the fan controller 122 and the override circuit 126 which in turn couples to fan 140. The PAL 130 may provide an override signal 131 ("OVERRIDE") to the override circuit 126. As will be explained below, the coordinated action of the override circuit 126 and PAL 130 may control the fan speed during the period of time in which a software driver is not present or is otherwise not available to control fan speed.

Under control of the health and status driver 116, the fan controller 122 may cause the fan 140 to spin at a desired speed by causing the fan controller to generate a suitable fan control ("FAN CTL") signal 125. In some embodiments, FAN CTL signal 125 may comprise an analog voltage whose magnitude is proportional to the desired fan speed. The fan speed may include 0 revolutions per minute ("RPM") which corresponds to the fan being turned off or a non-zero desired speed. The FAN CTL signal 125 passes through the override circuit 126 and is provided to the fan 140 as speed signal ("SPEED") 127. If a health and status driver 116 is present in the system 100, loaded into memory 104 and executed by CPU 102, the override circuit 126 is operated so as to permit the health and status driver 116 to control the speed of the fan 140 via the fan controller 122. As will be explained below, if the health and status driver 116 has not yet been loaded into memory 104 or the system 100 does not include a health and status driver, the override circuit 126 may be operated so as to permit PAL 130 to control the fan speed without software involved.

Referring still to FIG. 1, the I/O control 134 may comprise one or more shift registers configured to provide a scan chain. The I/O control 134 may provide one or more general purpose output signals. One such output signal may be connected to PAL 130 and is labeled in FIG. 1 as the PAL control ("PAL CTL") signal 135. The function performed by the PAL CTL signal 135 is to enable or disable the fan control override function of PAL 130. Thus, when a health and status driver 116 is being used to control the speed of fan 140, the PAL CTL signal 135 may be deasserted to disable the override functionality of PAL 130. However, when no health and status driver 116 is currently being used to control the speed of fan 140, the PAL CTL signal 135 may be asserted to enable the override functionality of PAL 130 to thereby permit a hardware-based fan control mechanism to be invoked. In general, the PAL 130 may be used to override the fan speed when either the health and status driver or ROM ("BIOS") setting is driving the FAN CTL signal 135.

With the PAL's override function disabled (i.e., driver 116 in control of fan speed), the override signal 131 ("OVERRIDE") may be deasserted by the PAL 130 to permit the fan controller 122 to control the fan speed via the fan control signal 125 and speed signal 127 under the authority of the health and status driver 116. When the PAL's override function is enabled, the PAL 130 may assert the OVERRIDE signal 131. The OVERRIDE signal 131 may cause the override circuit 126 to set the SPEED signal 127 to a predetermined level without regard to the level of the FAN CTL signal 125 from the fan controller 122. The fan controller 122 in this situation may not directly control the speed of the fan 140. The fan controller 122, however, may still be used in this override situation to inform the PAL 130 of the temperature level of a temperature sensor (e.g., sensor 123). Of course, other sources of temperature besides the fan controller 122 may also be implemented as desired. When the fan controller 122 determines that a temperature level has exceeded a programmed threshold (programmed by the health and status driver 116), the fan controller 122 may assert a temperature signal 129 ("TEMP") to the PAL 130. The TEMP signal 129 may comprise any suitable type of signal format such as an interrupt. In general, with the PAL's override capability enabled via the I/O controller 134, the PAL 130 may cause the fan 140 to spin at a predetermined speed when the fan controller 122 asserts the TEMP signal 129 indicating an over-temperature condition. The predetermined override fan speed may comprise the highest speed implemented in the system 100 for the fan 140, or other suitable fan speed. In other embodiments, the PAL 130 may control fan speed to any of a plurality of speeds based on the TEMP signal 129 encoding a specific temperature value or range of temperatures.

Upon system power-up, in some embodiments, the PAL 130 initially may be disabled and the fan controller 122 may be initialized for a relatively low fan speed. Eventually, during or after the boot process, the health and status driver 116 may become available for use at which time the driver 116 may increase the fan speed as necessary to maintain the system at an appropriate thermal level. During a time period before the health and status driver 116 is available for use, the I/O control 134 may assert the PAL CTL signal 135 to enable the override function of the PAL 130. The coordinated action of the PAL 130 and override circuit 126 may cause the fan 140 to spin at a predetermined speed, as explained above, without regard to the fan controller's attempt to control the fan speed via its fan control signal 125. Thus, with the PAL's override function enabled, both the fan controller 122 and the PAL 130 may attempt to control fan speed, but the override circuit 126 may permit only the PAL 130 to control fan speed. If and when a health and status driver 116 becomes available for use, the health and status driver may cause the control logic 120 and I/O control 134 to disable the override function performed by PAL 130 by deasserting the PAL CTL signal 135. At that point, the health and status driver 116 and fan controller 122 are permitted to control the speed of fan 140.

Figure 2:
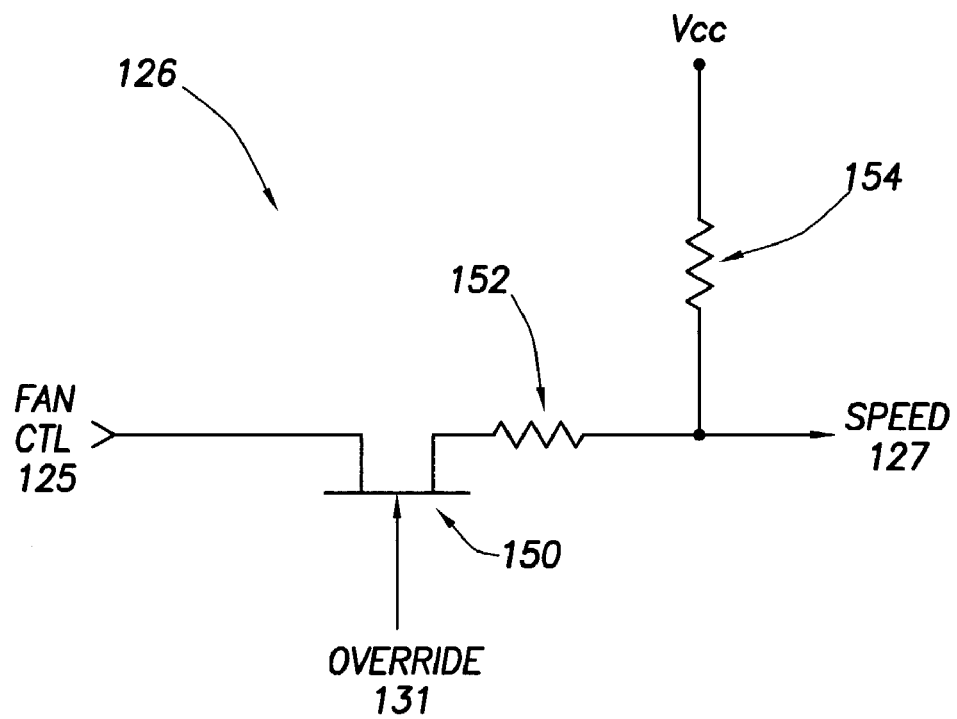
FIG. 2 shows an embodiment of an override circuit usable in the system of FIG. 1 in accordance with various embodiments of the invention.
Figure 3:
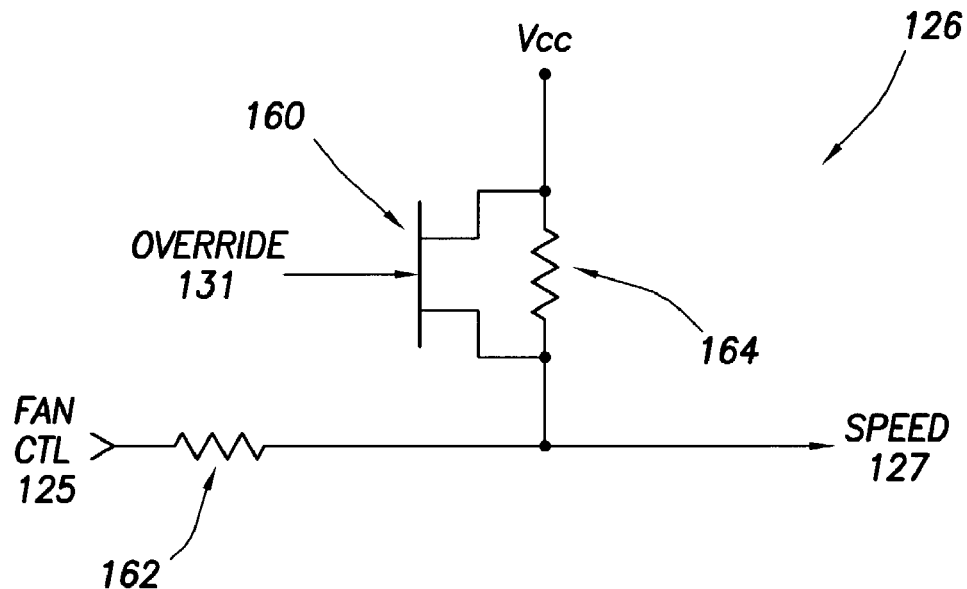
FIG. 3 shows another embodiment of the override circuit in accordance with various embodiments of the invention.

FIGS. 2 and 3 show various embodiments of the override circuit 126. In FIG. 2, the override circuit may comprise a pair of resistors 152 and 154 and a switch 150. The switch 150 may comprise any suitable type of switch such as a field effect transistor ("FET"). The FAN CTL signal 125 may be provided to a terminal (e.g., a source) of the switch 150 and another terminal (e.g., the drain) connects to resistor 152. Resistor 154 connects to voltage source (labeled as VCC). In the embodiment of FIG. 2, the OVERRIDE signal 131 may be implemented as active low. When the OVERRIDE signal 131 is deasserted (i.e., high logic level) to permit the health and status driver 116 to control fan speed via the fan controller 122, the switch 150 is caused to close (i.e., conduct) thereby permitting the FAN CTL signal 125 to be provided to resistor 152. In this state, resistors 152 and 154 connect so as to form a voltage divider which divides down the VCC source voltage in accordance with the FAN CTL signal level. As such the SPEED signal 127 may be proportional to the level of the FAN CTL signal 125 via the voltage divider combination of resistors 152 and 154.

If, however, the OVERRIDE signal 131 is asserted (to implement hardware control over fan speed), the switch 150 is caused to open (i.e., not conduct). In this state, the SPEED signal 127 may be approximately equal to the VCC voltage source through resistor 154. Accordingly, in this embodiment the SPEED signal 127 may be preset to spin the fan at the highest speed permitted by the system 100.

In FIG. 3, an embodiment of the override circuit 126 includes a pair of resistors 162 and 164 and a switch 160. Resistors 162, 164 may be connected as in FIG. 2 to form a voltage divider when the OVERRIDE signal 131 is deasserted. In the embodiment of FIG. 3, the OVERRIDE signal 131 may be implemented as active low. When the OVERRIDE signal is deasserted (i.e., health and status driver in control of fan speed), the switch 160 is open and the SPEED signal 127 is set at a level proportional to the FAN CTL signal 125 via the voltage divider 162, 164. When the OVERRIDE signal 131 is asserted (hardware override of fan speed desired), the switch 160 closes thereby effectively shorting resistor 164 and imposing a voltage approximately equal to VCC on node 166 which also represents the SPEED signal 127. Thus, asserting the OVERRIDE signal 131 causes the SPEED signal 127 to be set at a predetermined level associated with, or approximately equal to, VCC thereby causing the fan to spin at its highest setting.

In other embodiments of the invention, more than one fan 140 may included and controlled via fan controller 122, override 126 and PAL 130. Further still, the system 100 may include multiple fans with each fan including its own fan controller 122, override circuit 126 and PAL 130.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic system, comprising:
   a variable speed fan;
   a first control logic coupled to said fan;
   a second control logic coupled to said fan; and
   an override circuit coupled to said first control logic and said second control logic;
   wherein either of said first control logic and said second logic controls the speed of said fan;
   wherein said second control logic controls the speed of said fan without software involvement; and
   wherein said override circuit selectively permits a signal from said first control logic to control the fan or permits said second control logic to override the first control logic's ability to control the speed of the fan.

2. The electronic system of claim 1 wherein said first control logic comprises a software driver and said second control logic comprises a hardware circuit that controls the speed of said fan without software involvement.

3. The electronic system of claim 1 wherein, during initialization, said second control logic overrides the first control logic's ability to control the speed of the fan.

4. The electronic system of claim 1 wherein after initialization, said first control logic controls the speed of the fan and said second control does not control the speed of the fan.

5. The electronic system of claim 1 wherein the speed of the fan is initially controlled by the second control logic, and in response to the first control logic becoming available, said override circuit enables said first control logic to control the speed of the fan.

6. An electronic system, comprising:
   a variable speed fan;
   a first control logic coupled to said fan and providing a signal to said fan to control the speed of said fan; said first control logic comprising a software driver executed by the CPU and a fan controller device which is controlled by said software driver;

a second control logic coupled to said fan, wherein said second control logic overrides said first control logic and controls the speed of said fan without software involvement; said second control logic comprises a programmable array logic device that controls fan speed without software involvement an override circuit coupled to said fan and said fan controller device; and a CPU coupled to said fan;

wherein said fan controller device and said programmable array logic device couple to said override circuit, and said override circuit selectively permits a signal from said fan controller device to control the speed of the fan or permits said programmable array logic device to control the speed of the fan.

7. The electronic system of claim 6 wherein said second control logic overrides said first control logic during initialization.

8. The electronic device of claim 6 wherein said selection of whether said fan controller device signal or said programmable logic device is to control said fan speed is based on an override signal from said programmable array logic device, said programmable array logic device asserting said override signal when said programmable array logic device receives an enabled control signal from control logic coupled to said CPU and said fan controller device asserts an over-temperature signal to said programmable array logic device.

9. The electronic device of claim 8 wherein said override signal causes said override circuit to force the fan to spin at a predetermined speed.

10. A computer system, comprising:
a CPU;
a non-volatile memory device containing a software driver which is executed by said CPU;
a fan controller coupled to said CPU;
a logic circuit coupled to said fan controller;
an override circuit coupled to said fan controller and said logic circuit; and
a variable speed fan coupled to said override circuit;
wherein, when executed by said CPU, said software driver causes said fan controller to force said fan to spin at one of a plurality of different speeds; and
wherein, when said software driver is not executed by said CPU, said logic circuit causes said override circuit to force said fan to spin at a predetermined speed.

11. The computer system of claim 10 wherein said override circuit comprise a pair of resistors and a switch capable of operating in either a first state or a second state, while in the first state, said pair of resistors form a voltage divider through which said fan controller provides a fan control signal to control the fan speed, and while in the second state, a predetermined voltage is provided to said fan to force the fan to spin at said predetermined speed.

12. The computer system of claim 10 further including an I/O control circuit coupled to said logic circuit and providing a control signal that, when said software driver is being executed by said CPU, causes said logic circuit not to function to control the speed of the fan, and when said software driver is not being executed by said CPU, permits said logic circuit to assert an override signal to said override circuit to force said fan to spin at a predetermine speed.

13. The computer system of claim 12 wherein said fan controller has a temperature sensor associated therewith and said controller asserts a temperature signal to said logic circuit when the fan controller detects that a temperature associated with said temperature sensor has exceeded a threshold, said logic circuit causing said override signal to be asserted when said temperature signal is asserted by said fan controller and when control signal indicates that said software driver is not being executed by said CPU.

14. A method usable in conjunction with an electronic system having a variable speed fan, comprising:
loading a software driver, which when executed, forces the fan to spin at one of a plurality of different speeds;
selecting said software driver to control the fan's speed at one of a plurality of speeds; and
when the software driver is not executing, overriding control of speed of the fan with a hardware control mechanism to force the fan to spin at a predetermined speed without software involvement.

15. The method of claim 14 wherein selecting said software driver includes disabling said hardware control mechanism.

16. A computer system, comprising:
a fan controller comprising a temperature sensor that monitors temperature of the computer system;
a hardware logic circuit coupled to said fan controller;
an override circuit coupled to said fan controller and said hardware logic circuit; and
a variable speed fan coupled to said override circuit;
wherein, while the system boots, said hardware logic circuit causes said override circuit to force said fan to spin at a predetermined speed without software involvement when the temperature sensor indicates that the system has exceeded a threshold temperature.

17. The computer system of claim 16, further comprising:
a CPU;
a non-volatile memory device containing a software driver operable for execution by said CPU;
wherein when boot-up of the system is complete, said override circuit deasserts control by said hardware logic circuit, and said CPU executes said software driver, causing the fan controller to force said fan to spin at one of a plurality of different speeds.

18. The computer system of claim 17 further including an I/O control circuit coupled to said hardware logic circuit and providing a control signal that, when said software driver is being executed by said CPU, causes said hardware logic circuit not to function to control the speed of the fan, and when said software driver is not being executed by said CPU, permits said hardware logic circuit to assert an override signal to said override circuit to force said fan to spin at a predetermined speed.

19. The computer system of claim 16, wherein the hardware logic circuit and the override circuit control said fan when the system has completed boot-up when a software driver is not present or available.

20. The computer system of claim 16, wherein said override circuit comprise a pair of resistors and a switch capable of operating in either a first state or a second state, while in the first state, said pair of resistors form a voltage divider through which said fan controller provides a fan control signal to control the fan speed, and while in the second state, a predetermined voltage is provided to said fan, based on the temperature of the system detected by said temperature sensor, to force the fan to spin at said predetermined speed.

21. An electronic system, comprising:
a variable speed fan;
a first source control logic coupled to said fan and providing a signal to said fan to control the speed of said fan; and a second source control logic coupled to said fan, wherein said second source control logic overrides said first source control logic and controls the speed of said fan without software involvement;

wherein said first control logic device and said second control logic couple to an override circuit which also couples to said fan, said override circuit selectively permits a signal from said first control logic to control the speed of the fan or permits said second control logic to control the speed of the fan.

* * * * *

UNITED STATES PATENT AND TRADEMARK OFFICE
CERTIFICATE OF CORRECTION

| | | |
|---|---|---|
| PATENT NO. | : 7,196,903 B2 | Page 1 of 1 |
| APPLICATION NO. | : 10/407620 | |
| DATED | : March 27, 2007 | |
| INVENTOR(S) | : Vinh T. Vuong et al. | |

It is certified that error appears in the above-identified patent and that said Letters Patent is hereby corrected as shown below:

In column 7, line 62, in Claim 12, delete "predetermine" and insert -- predetermined --, therefor.

Signed and Sealed this

Eighteenth Day of November, 2008

JON W. DUDAS
*Director of the United States Patent and Trademark Office*